United States Patent
Liu et al.

(10) Patent No.: US 10,180,877 B2
(45) Date of Patent: Jan. 15, 2019

(54) SELECTIVE ERROR CORRECTION IN A DATA STORAGE DEVICE

(71) Applicant: Taiwan Semiconductor Manufacturing Co., Ltd., Hsinchu (TW)

(72) Inventors: Chien-Yin Liu, Hsinchu (TW); Hsueh-Chih Yang, Hsinchu (TW); Kuan-Chun Chen, Taipei (TW); Yue-Der Chih, Hsinchu (TW); Yi-Chun Shih, Taipei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 15/153,358

(22) Filed: May 12, 2016

(65) Prior Publication Data

US 2017/0329669 A1    Nov. 16, 2017

(51) Int. Cl.
| | |
|---|---|
| *G11C 29/00* | (2006.01) |
| *G06F 11/10* | (2006.01) |
| *G11C 29/52* | (2006.01) |
| *G11C 29/04* | (2006.01) |

(52) U.S. Cl.
CPC ...... *G06F 11/1068* (2013.01); *G06F 11/1048* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 7,095,698 B2 * | 8/2006 | Uchida | G11B 20/10009 369/53.31 |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |

(Continued)

*Primary Examiner* — Mujtaba M Chaudry
(74) *Attorney, Agent, or Firm* — Sterne, Kessler, Goldstein & Fox P.L.L.C.

(57) ABSTRACT

The present disclosure discloses a data storage device having error detection and correction capabilities. The data storage device includes an information encoder/decoder having error checking circuitry to determine whether one or more errors present in an input datastream. When the one or more errors are present in the input datastream, the information encoder/decoder activates error correction circuitry to correct the one or more errors when present in the input datastream. Otherwise, when the one or more errors are not present in the input datastream, the information encoder/decoder deactivates the error correction circuitry. This activation and deactivation conserves power when compared to conventional data storage devices. Any error correction circuitry, if present, in these conventional data storage devices continuously remain active even when the one or more errors are not present in the input datastream.

20 Claims, 6 Drawing Sheets

(56) References Cited

U.S. PATENT DOCUMENTS

| | | | |
|---|---|---|---|
| 2003/0043749 A1* | 3/2003 | Tanaka | H03M 13/00 370/241 |
| 2005/0149839 A1* | 7/2005 | Dent | H03M 13/2915 714/800 |
| 2008/0244362 A1* | 10/2008 | Liu | G06F 11/1068 714/758 |
| 2010/0318877 A1* | 12/2010 | Amato | H03M 13/29 714/755 |
| 2014/0153345 A1 | 6/2014 | Kim et al. | |
| 2014/0233330 A1 | 8/2014 | Ko et al. | |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |

* cited by examiner

SELECTIVE ERROR CORRECTION IN A DATA STORAGE DEVICE

BACKGROUND

A computer, or a computer system having multiple computers, often includes one or more data storage devices for reading and/or writing information. In some situations, electrical or magnetic interference inside the computer and/or the computer system corrupts the information stored within the one or more data storage devices. Often times, the computer and/or the computer system includes one or more data storage devices that detects and corrects the most common kinds of corruption. The one or more data storage devices utilize one or more error-correcting codes (ECCs) to add redundancy, in the form of one or more parity bits, to the information being written to the one or more data storage devices. The redundancy is used to verify that the information being read from the one or more data storage devices is consistent with the information that was previously written into the one or more data storage devices. With the most common kinds of corruption, the redundancy is also be used to correct for inconsistencies between the information being read from the one or more data storage devices and the information that was previously written into the one or more data storage devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
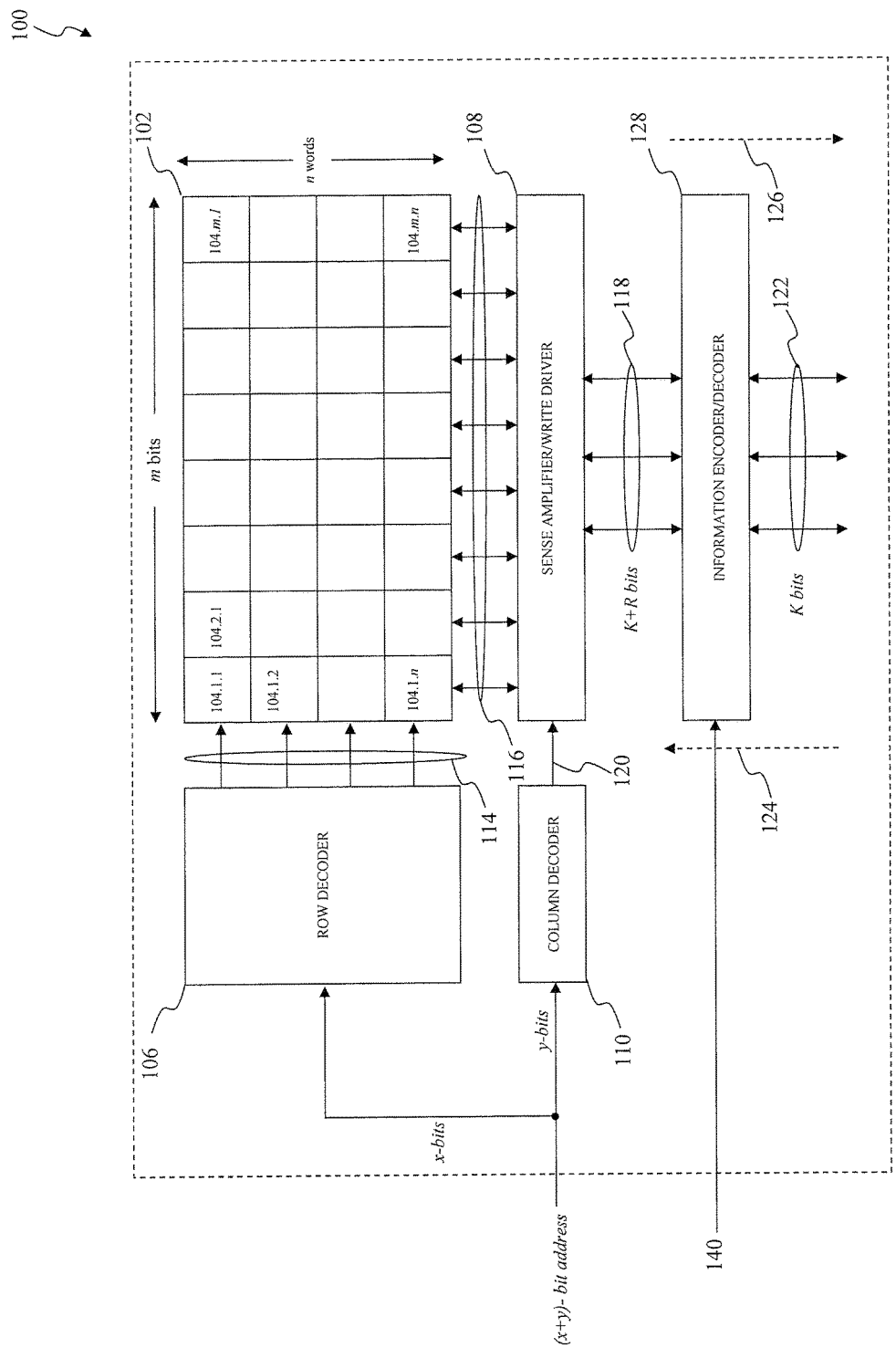
FIG. 1 illustrates a block diagram of a data storage device according to an exemplary embodiment of the present disclosure.

The following disclosure provides many different embodiments, or examples, for implementing different features of the provided subject matter. Specific examples of components and arrangements are described below to simplify the present disclosure. These are of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Overview

The present disclosure discloses a data storage device having error detection and correction capabilities. The data storage device includes an information encoder/decoder having error checking circuitry to determine whether one or more errors present in an input datastream. When the one or more errors are present in the input datastream, the information encoder/decoder activates error correction circuitry to correct the one or more errors when present in the input datastream. Otherwise, when the one or more errors are not present in the input datastream, the information encoder/decoder deactivates the error correction circuitry. This activation and deactivation conserves power when compared to conventional data storage devices. Any error correction circuitry, if present, in these conventional data storage devices continuously remain active even when the one or more errors are not present in the input datastream.

Exemplary Data Storage Device

FIG. 1 illustrates a block diagram of a data storage device according to an exemplary embodiment of the present disclosure. A data storage device 100 operates in first direction 124 to write information to one or more memory cells that are configured to form an array of memory cells or in second direction 126 to read to information from the one or more memory cells. The first direction 124 can also be referred to as a write mode of operation and the second direction 126 can also be referred to as a read mode of operation. In an exemplary embodiment, the data storage device 100 is implemented as a single port data storage device that operates in one of first direction 124 or second direction 126 at a time. In the read mode of operation, the data storage device 100 reads information from one or more memory cells corresponding to an (x+y)-bit address. Similarly, the data storage device 100 writes information to one or more memory cells corresponding to an (x+y)-bit address in the write mode of operation. The data storage device 100 can be implemented as volatile memory, such as random access memory (RAM), which requires power to maintain the information or non-volatile memory, such as read-only memory (ROM), which maintains the information even when not powered. The RAM can be implemented as dynamic random-access memory (DRAM), static random-access memory (SRAM), and/or non-volatile random-access memory (NVRAM), such as flash memory to provide an example. The data storage device 100 includes a memory array 102, a row decoder 106, a sense amplifier/write driver 108, a column decoder 110, and an information encoder/decoder 128.

The memory array 102 includes memory cells 104.1.1 through 104.*m.n* that are arranged in an array of m columns and n rows. However, other arrangements for the memory cells 104.1.1 through 104.*m.n* are possible without departing from the spirit and scope of the present disclosure. Each of the memory cells 104.1.1 through 104.*m.n* is connected to a corresponding WL from among the WLs 114.1 through 114.*n* and a corresponding BL from among the BLs 116.1 through 116.*m*. In an exemplary embodiment, the memory cells 104.1.1 through 104.*m.n* in each of the m columns of the memory array 102 shares a common BL from among the BLs 116.1 through 116.*m*. Similarly, the memory cells 104.1.1 through 104.*m.n* in each of n rows of the memory array 102 share a common WL from among the WLs 114.1 through 114.*n*. For example, as shown in FIG. 1, the memory cells 104.1.1 through 104.*m*.1 of row 1 of the memory array 102 share the WL 114.1 and the memory cells 104.*m*.1 through 104.*m.n* of column m of the memory array 102 the share BL 116.*m*.

To select a particular memory cell from among the memory cells 104.1.1 through 104.*m.n* for a mode of operation, such as the read mode of operation or the write mode of operation, to provide some examples, the BL associated with the particular memory cell is selected, and the WL associated with this particular memory cell is selected. For example, the BL 116.1 and the WL 114.1 are selected to select the memory cell 104.1.1. Thereafter, information is written into the selected memory cell in the write mode of operation, or information is read from the selected memory cell in the read mode of operation.

Each of the WLs 114.1 through 114.*n* is selectively asserted by applying a corresponding x-bit row address from among a corresponding (x+y)-bit address to the row decoder 106. A data storage device controller, not shown in FIG. 1, can be used to provide the x-bit row address to the data storage device 100. The row decoder 106 decodes the corresponding x-bit row address and provides one or more control signals to the WLs 114.1 through 114.*n* that correspond to the x-bit row address to select a row of memory cells from among the memory cells 104.1.1 through 104.*m.n*. Similarly, each of the BLs 116.1 through 116.*m* is selected by applying a corresponding y-bit column address from among the corresponding (x+y)-bit address to the column decoder 110. The column decoder 110 decodes the y-bit column address and provides one or more control signals 120 to sense the amplifier/write driver 108 that correspond to the y-bit column address. The sense amplifier/write driver 108 selects a column of memory cells from among the memory cells 104.1.1 through 104.*m.n* that corresponds to the y-bit column address.

The sense amplifier/write driver 108, using a sense amplifier, reads the information from a corresponding one or more BLs from among the BLs 116.1 through 116.*m* that corresponds to a selected one or more memory cells from among the memory cells 104.1.1 through 104.*m.n* during the read mode operation to provide K+R bits of information 118. Alternatively, the sense amplifier/write driver 108, using a write driver, receives K+R bits of the information 118 and writes the K+R bits of the information 118 to corresponding BLs from among the BLs 116.1 through 116.*m* that corresponds to a selected memory cell from among the memory cells 104.1.1 through 104.*m.n* during the write mode of operation.

The information encoder/decoder 128 generates R parity bits for K information bits of a datastream 122 and combines these R parity bits with the K information bits of the datastream 122 to provide the information 118 having the K+R bits when operating in the write mode of operation. The data storage device controller, not shown in FIG. 1, can be used to provide the control signal 140 to data storage device 100 to control operation of information encoder/decoder 128. Otherwise, the information encoder/decoder 128 receives the information 118 having the K+R bits when operating in a first mode of the read mode of operation. In this first mode of the read mode of operation, the information encoder/decoder 128 separates the K information bits from the information 118 having the K+R bits and generates the R' parity bits from the K information bits of the information 118. Thereafter, the information encoder/decoder 128 compares the R parity bits and the R' parity bits. When the R parity bits and the R' parity bits are the same, this indicates that the K information bits from the information 118 are error free. In this situation, the information encoder/decoder 128 provides the K bits as the datastream 122. In an exemplary embodiment, when the K information bits from the information 118 are error free, the information encoder/decoder 128 bypasses any error correcting functionality to directly provide the K bits as the datastream 122. Otherwise, when the R parity bits and the R' parity bits are different, this indicates that the K information bits contains one or more errors. In this situation, the information encoder/decoder 128 corrects the one or more errors, when present, to provide the datastream 122 having K error corrected information bits. This first mode of operation is further described in FIG. 2 through FIG. 3.

The information encoder/decoder 128 likewise receives the information 118 having the K+R bits when operating in a second mode of the read mode of operation. In this second mode of the read mode of operation, the information encoder/decoder 128 generates syndrome codewords from the K information bits of the information 118. Thereafter, the information encoder/decoder 128 compares two or more of the syndrome codewords. When the two or more of the syndrome codewords are the same, this indicates that the K information bits from the information 118 are error free. In this situation, the information encoder/decoder 128 provides the K bits as the datastream 122. In an exemplary embodiment, when the K information bits from the information 118 are error free, the information encoder/decoder 128 bypasses any error correcting functionality to directly provide the K bits as the datastream 122. Otherwise, when the two or more of the syndrome codewords are different, this indicates that the K information bits contains one or more errors. In this situation, the information encoder/decoder 128 corrects the one or more errors, when present, to provide the datastream 122 having K error corrected information bits. This second mode of operation is further described in FIG. 4 through FIG. 6.

Figure 2:
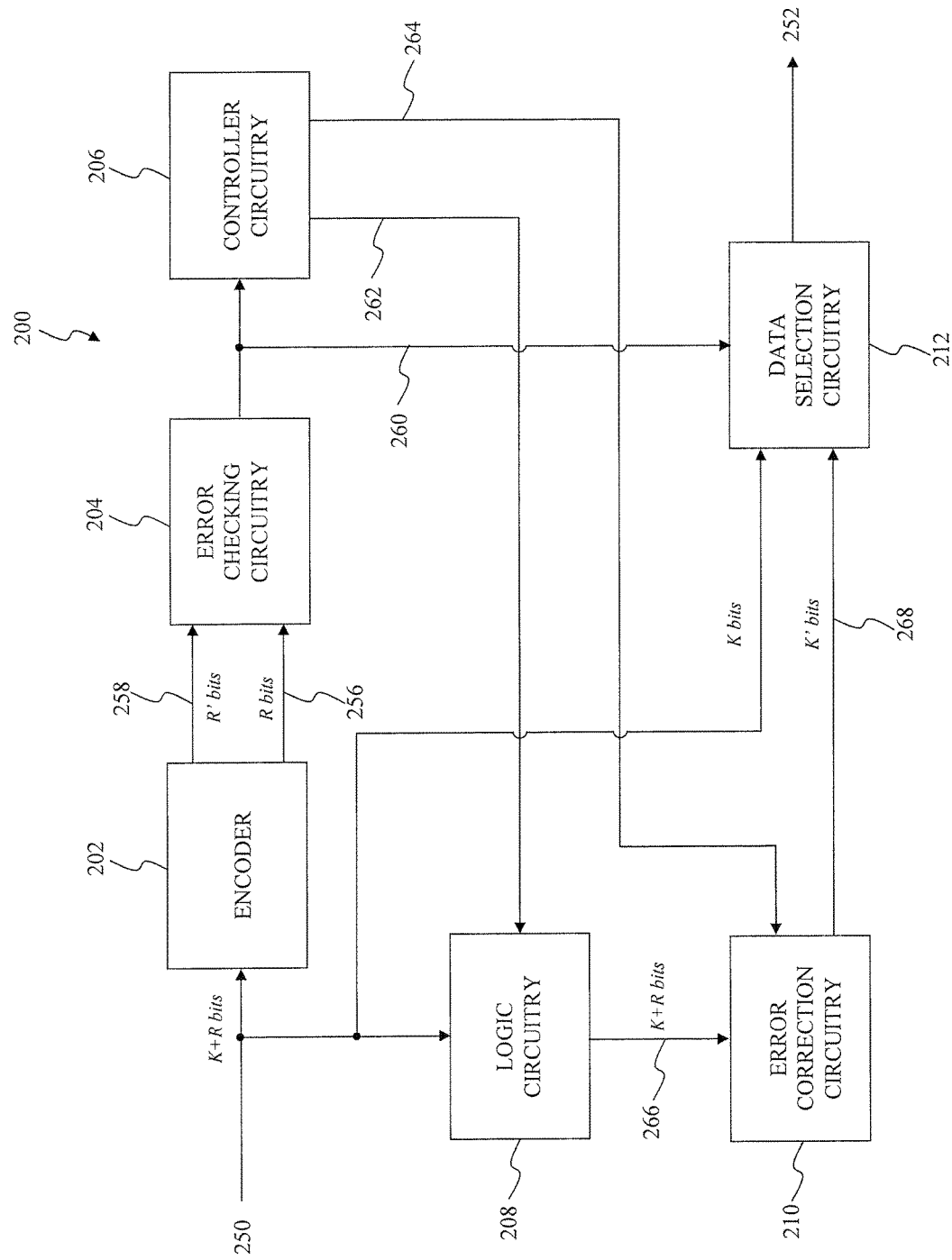
FIG. 2 illustrates a block diagram of a first exemplary information encoder/decoder that can be implemented as part of the data storage device according to an exemplary embodiment of the present disclosure.

First Exemplary Information Encoder/Decoder that can be Implemented as Part of the Data Storage Device FIG. 2 illustrates a block diagram of a first exemplary information encoder/decoder that can be implemented as part of the data storage device according to an exemplary embodiment of the present disclosure. An information encoder/decoder 200 receives K+R bits of an input datastream 250 provided by a memory cell, such as the information 118 to provide an example, operating in a read mode of operation. In an exemplary embodiment, the R parity bits are generated by a data storage device, such as the data storage device 100 to provide an example, before writing the K information bits into a memory array, such as the memory array 102 to provide an example, in a write mode of operation. In this exemplary embodiment, the K information bits and the R parity bits are retrieved from the memory array during a read mode of operation to provide the input datastream 250 for the information encoder/decoder 200. The information encoder/decoder 200 selectively corrects for one or more errors, when present, in the K information bits of the input datastream 250 to provide an output datastream 252. The output datastream 252 includes K' error corrected information bits when the one or more errors were present in the K information bits of the input datastream 250 or the K information bits of the input datastream 250 when the one or more errors are not present in the K information bits of the input datastream 250. As illustrated in FIG. 2, the information encoder/decoder 200 includes an encoder 202, error checking circuitry 204, controller circuitry 206, logic circuitry 208, error correction circuitry 210, and data selection circuitry 212. The information encoder/decoder 200 can represent an exemplary embodiment of read mode of operation circuitry for the information encoder/decoder 128 of the data storage device 100.

The encoder 202 separates the K+R bits of the input datastream 250 into the K information bits and the R parity bits. The encoder 202 provides the R parity bits as a write parity stream 256 to the error checking circuitry 204. Thereafter, the encoder 202 generates R' parity bits from the K information bits of input datastream 250 in accordance with an ECC, such as a Hamming ECC code to provide an example. However, those of ordinary skill in the relevant art(s) will recognize that the encoder 202 can use other block codes such as a Reed-Solomon FCC code, a Golay ECC code, a Bose, Chaudhuri, Hocquenghem (BCH) ECC code, or a multidimensional parity ECC code to provide some examples, and/or convolutional codes, such as a low-density parity-check (LDPC) ECC code or a turbo ECC code to provide some examples, without departing from the spirit and scope of the present disclosure. In an exemplary embodiment, the encoder 202 utilizes the same ECC to generate the R' parity bits from the K information bits that was used to generate the R parity bits of the input datastream 250 from the K information bits. The encoder 202 provides the R' parity bits as a read parity stream 258 to the error checking circuitry 204.

The error checking circuitry 204 compares the R parity bits of the write parity stream 256 to the R' parity bits of the read parity stream 258 to determine whether the one or more errors are present in the K information bits of the input datastream 250. In an exemplary embodiment, the error checking circuitry 204 provides an error indication 260 at a first logic level, such as a logical one to provide an example, when the R parity bits of the write parity stream 256 differ from the R' parity bits of the read parity stream 258 to indicate that the one or more errors are present in the K information bits of the input datastream 250. Otherwise, in this exemplary embodiment, the error checking circuitry 204 provides the error indication 260 at a second logic level, such as a logical zero to provide an example, when the R parity bits of the write parity stream 256 are the same as the R' parity bits of the read parity stream 258 to indicate that the one or more errors are not present in the K information bits of the input datastream 250.

The controller circuitry 206 controls the overall configuration and operation of the information encoder/decoder 200. The controller circuitry 206 provides a correction enable 262 to the logic circuitry 208 at a first logic level, such as a logical one to provide an example, when the error indication 260 indicates that the one or more errors are present in the K information bits of the input datastream 250. Otherwise, the controller circuitry 206 provides the correction enable 262 to the logic circuitry 208 at a second logic level, such as a logical zero to provide an example, when the error indication 260 indicates that the one or more errors are not present in the K information bits of the input datastream 250. Additionally, the controller circuitry 206 provides a power enable 264 to the error correction circuitry 210 at a first logic level, such as a logical one to provide an example, when the error indication 260 indicates that the one or more errors are present in the K information bits of the input datastream 250. Otherwise, the controller circuitry 206 provides the power enable 264 to the error correction circuitry 210 at a second logic level, such as a logical zero to provide an example, when the error indication 260 indicates that the one or more errors are not present in the K information bits of the input datastream 250.

The logic circuitry 208 provides the K+R bits of the input datastream 250 to the error correction circuitry 210 as an error corrupted datastream 266 when the error checking circuitry 204 indicates the one or more errors are present in the K information bits of the input datastream 250. The logic circuitry 208 includes one or more logical gates, such as one or more logical AND gates, one or more logical OR gates, one or more logical INVERTER gates, one or more logical NAND gates, one or more logical NOR gates, or any combination thereof. In an exemplary embodiment, the logic circuitry 208 includes one or more logical AND gates. In this exemplary embodiment, the logic circuitry 208 performs a logical AND operation on the K+R bits of the input datastream 250 and the correction enable 262 to provide the error corrupted datastream 266.

The error correction circuitry 210 performs error correction on the K information bits of the error corrupted datastream 266 to provide K' information bits of an error corrected datastream 268 when the power enable 264 as at the first logic level indicating that the one or more errors are present in the K information bits of the input datastream 250. In an exemplary embodiment, the error correction circuitry 210 is disabled, namely operating in a power-saving mode or sleep mode of operation, when the power enable 264 as at the second logic level indicating that the one or more errors are not present in the K information bits of the input datastream 250. In this sleep mode of operation, the error correction circuitry 210 can be considered to be powered-off. Additionally in this exemplary embodiment, the error correction circuitry 210 is enabled, namely operating in a normal mode of operation, when the power enable 264 as at the first logic level indicating that the one or more errors are present in the K information bits of the input datastream 250. In this normal mode of operation, the error correction circuitry 210 can be considered to be powered-on. When in the normal mode of operation, the error correction circuitry 210 uses the R parity bits of the error corrupted datastream 266 to adjust one or more bits of the K information bits of the error corrupted datastream 266 in accordance with an error correction code to correct for the one or more errors present in the K information bits of the error corrupted datastream 266. The error correction code can include block codes such as a Hamming code, a Reed-Solomon code, a Golay code, a Bose, Chaudhuri, Hocquenghem (BCH) code, or a multidimensional parity code to provide some examples, and/or convolutional codes, such as a low-density parity-check (LDDC) code or a turbo code to provide some examples.

The data selection circuitry 212 selects the K information bits of the input datastream 250 when the one or more errors are not present in the K information bits of the input datastream 250 as the output datastream 252. Alternatively, the data selection circuitry 212 selects the K' information bits of the error corrected datastream 268 when the one or more errors are present in the K information bits of the input datastream 250 as the output datastream 252. In an exemplary embodiment, the data selection circuitry 212 is implemented using a multiplexing circuit which is responsive to the error indication 260. In this exemplary embodiment, the multiplexing circuit selects the K' information bits of the error corrected datastream 268 when the error indication 260 is at the first logic level, namely logical one, indicating that the one or more errors are present in the K information bits of the input datastream 250 or the multiplexing circuit selects the K information bits of the input datastream 250 when the error indication 260 is at the second logic level, namely logical zero, indicating that the one or more errors are not present in the K information bits of the input datastream 250.

Exemplary Operation of the First Exemplary Information Encoder/Decoder

Figure 3:
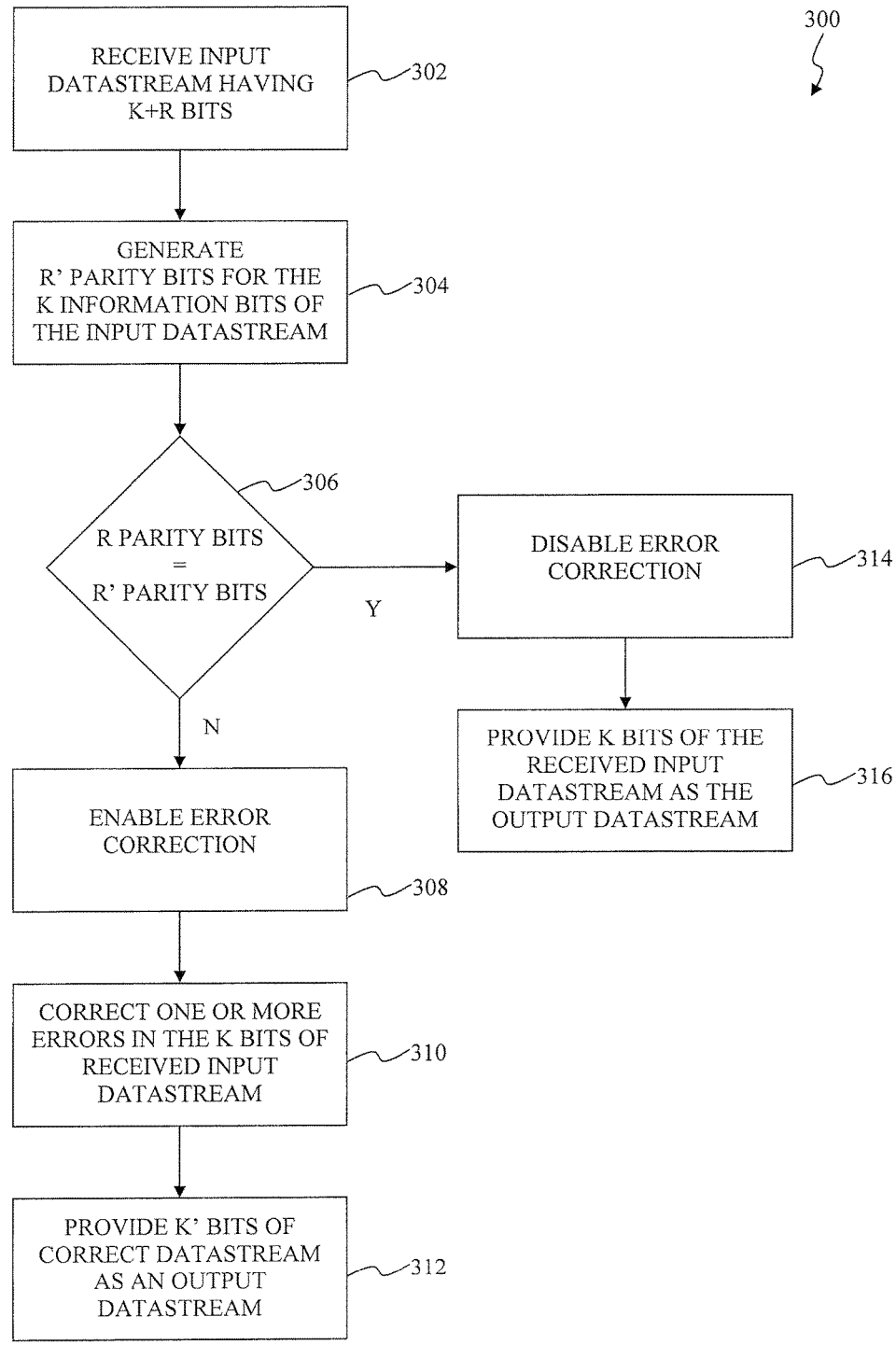
FIG. 3 is a flowchart of an exemplary operational control flow of the first exemplary information encoder/decoder of FIG. 1 according to an exemplary embodiment of the present disclosure.

FIG. 3 is a flowchart of an exemplary operational control flow of the first exemplary information encoder/decoder of FIG. 1 according to an exemplary embodiment of the present disclosure. The disclosure is not limited to this operational control flow. Rather, it will be apparent to ordinary persons skilled in the relevant art(s) that other operational control flows are within the scope and spirit of the present disclosure. The following discussion describes an exemplary operational control flow 300 of an information encoder/decoder, such as the information encoder/decoder 200 to provide an example.

At step 302, the operational control flow 300 receives an input datastream, such as the input datastream 250 to provide an example, having K information bits and R parity bits.

At step 304, the operational control flow 300 generates R' parity bits from the K information bits of the input datastream of step 302 in accordance with an ECC, such as a Hamming ECC code to provide an example. However, those of ordinary skill in the relevant art(s) will recognize that the operational control flow 300 can use other block codes such as a Reed-Solomon ECC code, a Golay ECC code, a Bose, Chaudhuri, Hocquenghem (BCH) ECC code, or a multidimensional parity ECC code to provide some examples, and/or convolutional codes, such as a low-density parity-check (LDPC) FCC code or a turbo ECC code to provide some examples, without departing from the spirit and scope of the present disclosure.

At step 306, the operational control flow 300 compares the R parity bits of the input datastream of step 302 to the R' parity bits generated in step 304 to determine whether one or more errors are present in the K information bits of the input datastream of step 302. If the R parity bits of the input datastream of step 302 are not equal to the R' parity bits generated in step 304, the operational control flow 300 proceeds to step 308. This non-equivalence of the R parity bits of the input datastream of step 302 and the R' parity bits generated in step 304 indicates the one or more errors are present in the K information bits of the input datastream of step 302. Otherwise, the operational control flow 300 proceeds to step 314 when the R parity bits of the input datastream of step 302 are equal to the R' parity bits generated in step 304. This equivalence of the R parity bits of the input datastream of step 302 and the R' parity bits generated in step 304 indicates the one or more errors are not present in the K information bits of the input datastream of step 302.

At step 308, the operational control flow 300 has determined that one or more errors are present in the K information bits of the input datastream of step 302. In this step, the operational control flow 300 enables error correction circuitry, such as the error correction circuitry 210 to provide an example, that is used to correct one or more errors present in the K information bits of step 302.

At step 310, the operational control flow 300 performs error correction on the K information bits of the input datastream of step 302 using the correction circuitry enabled in step 308 to provide K' information bits of an error corrected datastream. The operational control flow 300 uses the R parity bits of the input datastream of step 302 to adjust one or more bits of the K information bits of the input datastream of step 302 in accordance with an error correction code. The error correction code can include block codes such as a Hamming code, a Reed-Solomon code, a Golay code, a Bose, Chaudhuri, Hocquenghem (BCH) code, or a multidimensional parity code to provide some examples, and/or convolutional codes, such as a low-density parity-check (LDDC) code or a turbo code to provide some examples.

At step 312, the operational control flow 300 provides the K' information bits of the error corrected datastream of step 310 as an output datastream.

At step 314, the operational control flow 300 has, determined that one or more errors are not present in the K information bits of the input datastream of step 302. In this step, the operational control flow 300 disables the error correction circuitry, such as the error correction circuitry 210 to provide an example, that is used to correct one or more errors present in the K information bits of step 302.

At step 316, the operational control flow 300 provides the K information bits of the input datastream of step 302 as the output datastream.

Figure 4:
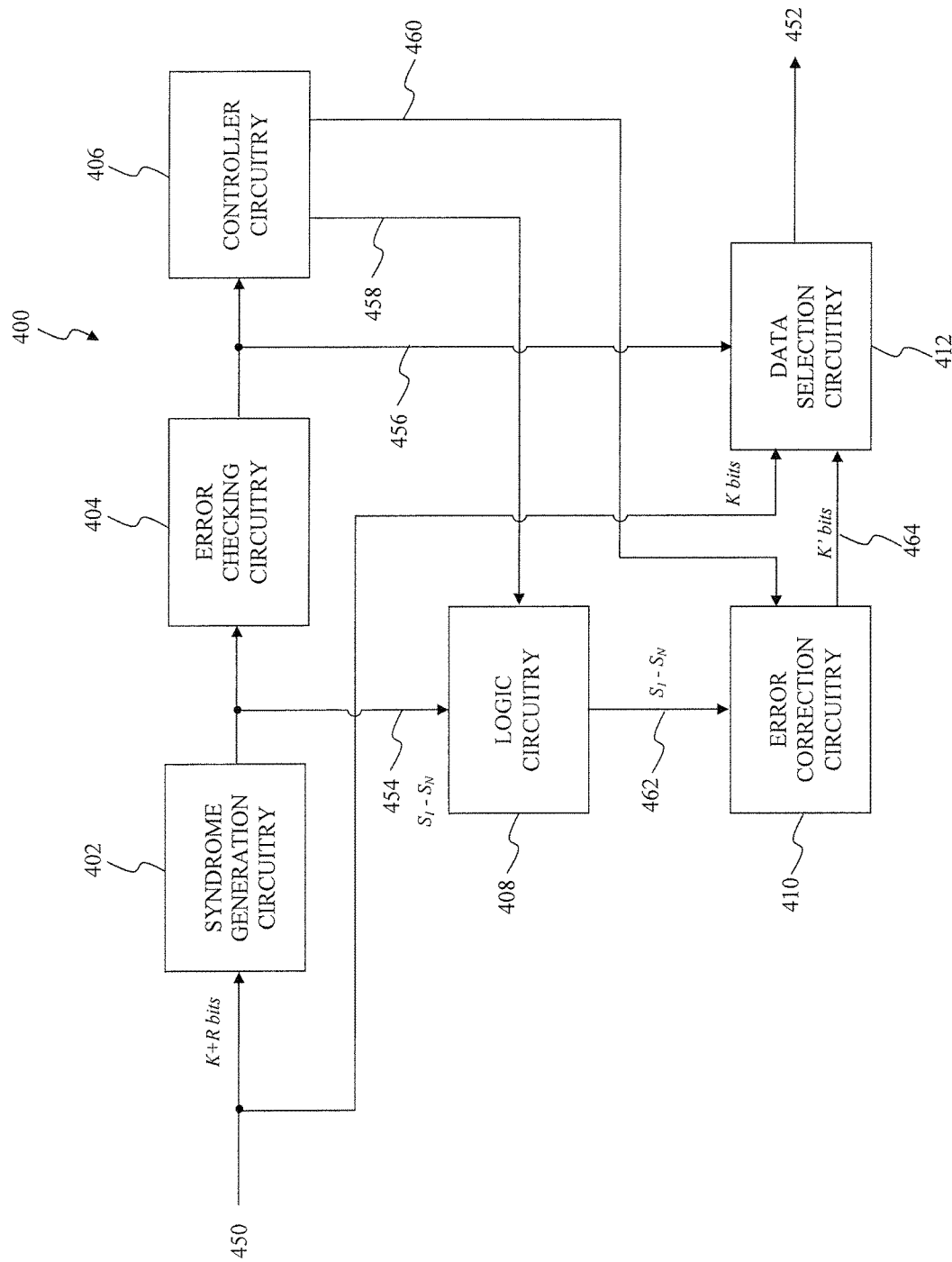
FIG. 4 illustrates a block diagram of a second exemplary information encoder/decoder that can be implemented as part of the data storage device according to an exemplary embodiment of the present disclosure.

Second Exemplary Information Encoder/Decoder that can be Implemented as Part of the Data Storage Device FIG. 4 illustrates a block diagram of a second exemplary information encoder/decoder that can be implemented as part of the data storage device according to an exemplary embodiment of the present disclosure. An information encoder/decoder 400 receives K information bits and R parity bits of an input datastream 450 provided by a memory cell, such as the information 118 to provide an example, operating in a read mode of operation. The information encoder/decoder 400 selectively corrects for the one or more errors, when present, in the K information bits of the input datastream 450 to provide an output datastream 452. The output datastream 452 includes K' error corrected information bits when the one or more errors were present in the K information bits of the input datastream 450 or the K information bits of the input datastream 450 when the one or more errors are not present in the K information bits of the input datastream 450. As illustrated in FIG. 4, the information encoder/decoder 400 includes syndrome generation circuitry 402, error checking circuitry 404, controller circuitry 406, logic circuitry 408, error correction circuitry 410, and data selection circuitry 412.

The syndrome generation circuitry 402 translates the K information bits of the input datastream 450 into syndrome codewords 454 having syndrome codewords $S_1$ through $S_N$ in accordance with a syndrome encoding scheme. The syndrome encoding scheme represents a linear block encoding scheme that converts one or more of the K information bits into one or more corresponding syndrome codewords from among the syndrome codewords $S_1$ through $S_N$. The syndrome encoding scheme is well known to those skilled in the art, and therefore will not be discussed in further detail. Typically, when all of the syndrome codewords $S_1$ through $S_N$ are of the same logical value, such as logical zero to provide an example, this indicates that the one or more errors are not present in the K information bits of the input datastream 450. However, when one or more of the syndrome codewords $S_1$ through $S_N$ are of different logical values, this indicates that the one or more errors are present in the K information bits of the input datastream 450.

The error checking circuitry 404 compares one or more of the syndrome codewords $S_1$ through $S_N$ of the syndrome codewords 454, such as the syndrome codeword $S_1$ and the syndrome codeword $S_3$ to provide an example, to each other to determine whether the one or more errors are present in the K information bits of the input datastream 450. In an exemplary embodiment, the error checking circuitry 404 provides an error indication 456 at a first logic level, such as a logical one to provide an example, when the one or more of the syndrome codewords differ from each other to indicate that the one or more errors are present in the K information bits of the input datastream 450. Otherwise, in this exemplary embodiment, the error checking circuitry 404 provides the error indication 456 at a second logic level, such as a logical zero to provide an example, when the one or more of the syndrome codewords are similar to each other to indicate that the one or more errors are not present in the K information bits of the input datastream 450.

The controller circuitry 406 controls the overall configuration and operation of the information encoder/decoder 400. The controller circuitry 406 provides a correction enable 458 to the logic circuitry 408 at a first logic level, such as a logical one to provide an example, when the error indication 456 indicates that the one or more errors are present in the K information bits of the input datastream 450. Otherwise, the controller circuitry 406 provides the correction enable 458 to the logic circuitry 408 at a second logic level, such as a logical zero to provide an example, when the error indication 456 indicates that the one or more errors are not present in the K information bits of the input datastream 450. Additionally, the controller circuitry 406 provides a power enable 460 to the error correction circuitry 410 at a first logic level, such as a logical one to provide an example, when the error indication 456 indicates that the one or more errors are present in the K information bits of the input datastream 450. Otherwise, the controller circuitry 406 provides the power enable 460 to the error correction circuitry 410 at a second logic level, such as a logical zero to provide an example, when the error indication 456 indicates that the one or more errors are not present in the K information bits of the input datastream 450

The logic circuitry 408 provides the syndrome codewords $S_1$ through $S_N$ of the syndrome codewords 454 to the error correction circuitry 410 as error corrupted codewords 462 when the error checking circuitry 404 indicates the one or more errors are present in the K information bits of the input datastream 450. The logic circuitry 408 includes one or more logical gates, such as one or more logical AND gates, one or more logical OR gates, one or more logical INVERTER gates, one or more logical NAND gates, one or more logical NOR gates, or any combination thereof. In an exemplary embodiment, the logic circuitry 408 includes one or more logical AND gates. In this exemplary embodiment, the logic circuitry 408 performs a logical AND operation on the syndrome codewords $S_1$ through $S_N$ of the syndrome codewords 454 and the correction enable 458 to provide the error corrupted codewords 462.

The error correction circuitry 410 performs error correction on the syndrome codewords $S_1$ through $S_N$ of the error corrupted codewords 462 to provide K' information bits of an error corrected datastream 464 when the power enable 460 as at the first logic level indicating that the one or more errors are present in the K information bits of the input datastream 450. In an exemplary embodiment, the error correction circuitry 410 is disabled, namely operating in a power-saving mode or sleep mode of operation, when the power enable 460 as at the second logic level indicating that the one or more errors are not present in the K information bits of the input datastream 450. In this sleep mode of operation, the error correction circuitry 410 can be considered to be powered-off. Additionally in this exemplary embodiment, the error correction circuitry 410 is enabled, namely operating in a normal mode of operation, when the power enable 460 as at the first logic level indicating that the one or more errors are present in the K information bits of the input datastream 450. In this normal mode of operation, the error correction circuitry 410 can be considered to be powered-on. When in the normal mode of operation, the error correction circuitry 410 performs error correction on the syndrome codewords $S_1$ through $S_N$ of the error corrupted codewords 462 in accordance with the syndrome coding scheme to provide K' information bits of an error corrected datastream 464 to correct for the one or more errors present in the K information bits of the error corrupted datastream 462. This error correction on the syndrome codewords $S_1$ through $S_N$ of the error corrupted codewords 462 using the syndrome encoding scheme is well known to those skilled in the art, and therefore will not be discussed in further detail.

The data selection circuitry 412 selects the K information bits of the input datastream 450 when the one or more errors are not present in the K information bits of the input datastream 450 as the output datastream 452. Alternatively, the data selection circuitry 412 selects the K' information bits of the error corrected datastream 464 when the one or more errors are present in the K information bits of the input datastream 450 as the output datastream 452. In an exemplary embodiment, the data selection circuitry 412 is implemented using a multiplexing circuit which is responsive to the error indication 456. In this exemplary embodiment, the multiplexing circuit selects the K' information bits of the error corrected datastream 464 when the error indication 456 is at the first logic level, namely logical one, or the multiplexing circuit selects the K information bits of the input datastream 450 when the error indication 456 is at the second logic level, namely logical zero.

Figure 5:
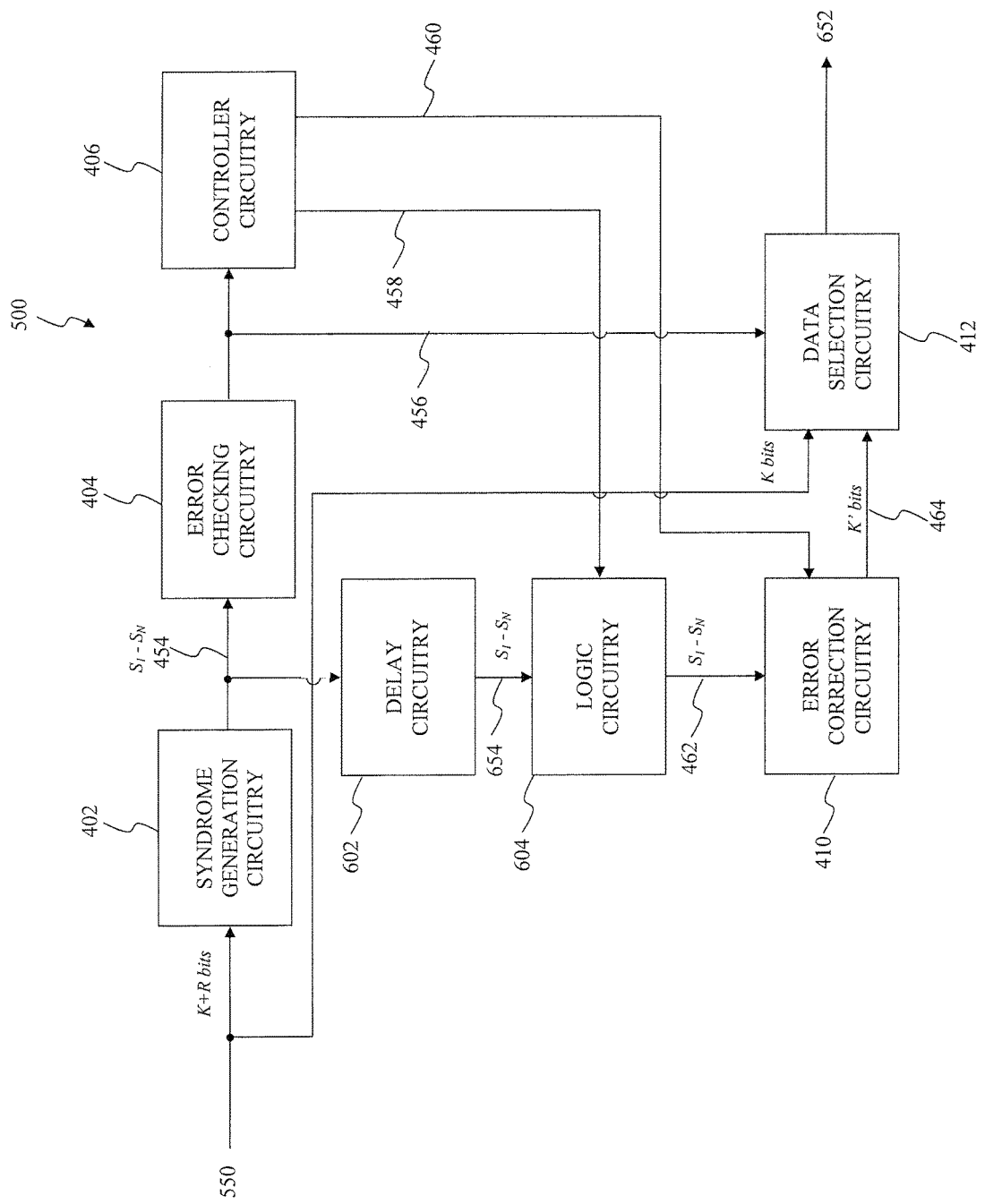
FIG. 5 illustrates a block diagram of a third exemplary information encoder/decoder that can be implemented as part of the data storage device according to an exemplary embodiment of the present disclosure.

Third Exemplary Information Encoder/Decoder that can be Implemented as Part of the Data Storage Device FIG. 5 illustrates a block diagram of a third exemplary information encoder/decoder that can be implemented as part of the data storage device according to an exemplary embodiment of the present disclosure. An information encoder/decoder 500 receives K information bits and R parity bits of an input datastream 550 provided by a memory cell, such as the information 118 to provide an example, operating in a read mode of operation. The information encoder/decoder 500 selectively corrects for the one or more errors, when present, in the K information bits of the input datastream 550 to provide an output datastream 652. The output datastream 652 includes K' error corrected information bits when the one or more errors were present in the K information bits of the input datastream 550 or the K information bits of the input datastream 550 when the one or more errors are not present in the K information bits of the input datastream 550. As illustrated in FIG. 5, the information encoder/decoder 500 includes the syndrome generation circuitry 402, the error checking circuitry 404, the controller circuitry 406, the error correction circuitry 410, the data selection circuitry 412, delay circuitry 602, and logic circuitry 604. The information encoder/decoder 500 operates in a substantially similar manner as the information encoder/decoder 400; therefore, only differences between the information encoder/decoder 400 and the information encoder/decoder 500 are to be discussed in further detail.

The delay circuitry 602 delays the syndrome codewords $S_1$ through $S_N$ of the syndrome codewords 454 to provide delayed syndrome codewords 654 having the syndrome codewords $S_1$ through $S_N$. In an exemplary embodiment, the delay circuitry 602 delays the syndrome codewords $S_1$ through $S_N$ by a sufficient amount to allow the error checking circuitry 404 to determine whether the one or more errors are present in the K information bits of the input datastream 550.

The logic circuitry 604 provides the syndrome codewords $S_1$ through $S_N$ of the delayed syndrome codewords 654 to the error correction circuitry 410 as the error corrupted codewords 462 when the error checking circuitry 404 indicates the one or more errors are present in the K information bits of the input datastream 550. The logic circuitry 604 includes one or more logical gates, such as one or more logical AND gates, one or more logical OR gates, one or more logical INVERTER gates, one or more logical NAND gates, one or more logical NOR gates, or any combination thereof. In an exemplary embodiment, the logic circuitry 604 includes one or more logical AND gates. In this exemplary embodiment, the logic circuitry 604 performs a logical AND operation on the syndrome codewords $S_1$ through $S_N$ of the delayed syndrome codewords 654 and the correction enable 458 to provide the error corrupted codewords 462.

Figure 6:
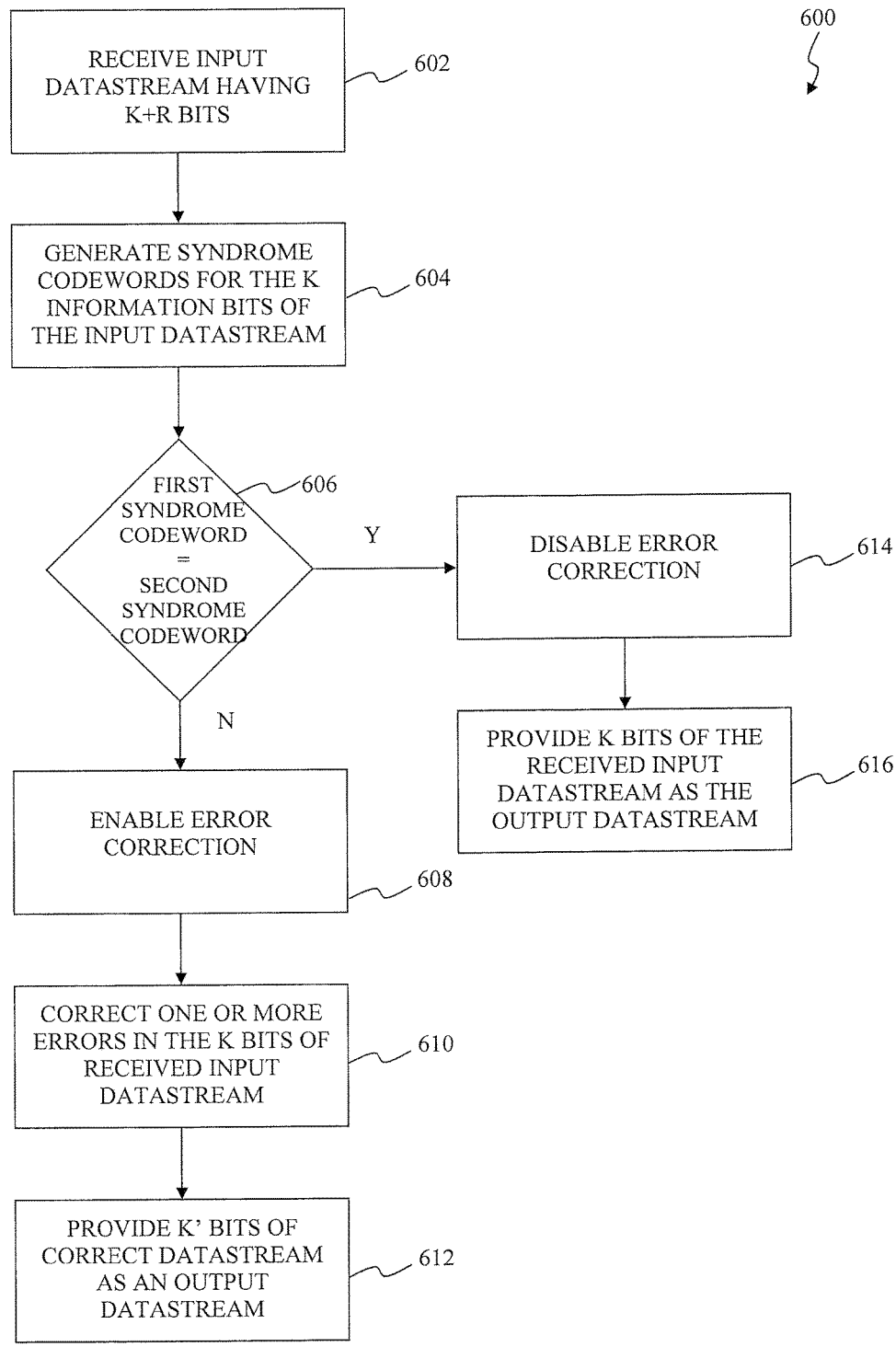
FIG. 6 is a flowchart of an exemplary operational control flow of the second exemplary information encoder/decoder of FIG. 4 and/or the third exemplary information encoder/decoder of FIG. 5 according to an exemplary embodiment of the present disclosure.

Exemplary Operation of the Second and the Third Exemplary Information Encoder/Decoders FIG. 6 is a flowchart of an exemplary operational control flow of the second exemplary information encoder/decoder of FIG. 4 and/or the third exemplary information encoder/decoder of FIG. 5 according to an exemplary embodiment of the present disclosure. The disclosure is not limited to this operational control flow. Rather, it will be apparent to ordinary persons skilled in the relevant art(s) that other operational control flows are within the scope and spirit of the present disclosure. The following discussion describes an exemplary operational control flow 600 of an information encoder/decoder, such as the information encoder/decoder 400 and/or the information encoder/decoder 500 to provide some examples.

At step 602, the operational control flow 600 receives an input datastream, such as the input datastream 460 to provide an example, having K information bits and R parity bits.

At step 604, the operational control flow 600 translates the K information bits of the input datastream of step 602 into syndrome codewords having syndrome codewords $S_1$ through $S_N$ in accordance with a syndrome encoding scheme. The syndrome encoding scheme represents a linear block encoding scheme that converts one or more of the K information bits into one or more corresponding syndrome codewords from among the syndrome codewords $S_1$ through $S_N$. The syndrome encoding scheme is well known to those skilled in the art, and therefore will not be discussed in further detail.

At step 606, the operational control flow 600 compares a first syndrome codeword from among the syndrome codewords $S_1$ through $S_N$ of step 604 and a second syndrome codeword from among the syndrome codewords $S_1$ through $S_N$ of step 604 to determine whether one or more errors are present in the K information bits of the input datastream of step 602. In an exemplary embodiment, the first syndrome codeword and the second syndrome codeword represent the syndrome codeword $S_1$ and the syndrome codeword $S_3$, respectively. If the first syndrome codeword is not equal to the second syndrome codeword, the operational control flow 600 proceeds to step 608. This non-equivalent of the first syndrome codeword and the second syndrome codeword indicates the one or more errors are present in the K information bits of the input datastream of step 602. Otherwise, the operational control flow 600 proceeds to step 614 when the first syndrome codeword is equal to the second syndrome codeword. This equivalence of the first syndrome codeword and the second syndrome codeword indicates the one or more errors are not present in the K information bits of the input datastream of step 602.

At step 608, the operational control flow 600 has determined that one or more errors are present in the K information bits of the input datastream of step 602. In this step, the operational control flow 600 enables error correction circuitry, such as the error correction circuitry 410 to provide some examples, that is used to correct one or more errors present in the K information bits of step 602.

At step 610, the operational control flow 600 performs error correction on the syndrome codewords of step 604 to correct for one or more errors in the K information bits of the input datastream of step 602. In an exemplary embodiment, the syndrome codewords of step 604 can be delayed by a sufficient amount to allow step 506 to determine whether the one or more errors are present in the K information bits of the input datastream of step 602. The operational control flow 600 performs error correction on the syndrome codewords $S_1$ through $S_N$ of step 606 to correct for the one or more errors present in the K information bits of step 602 to provide K information bits of an error corrected datastream. This error correction on the syndrome codewords $S_1$ through $S_N$ of step 606 using the syndrome encoding scheme is well known to those skilled in the art, and therefore will not be discussed in further detail.

At step 612, the operational control flow 600 provides the K' information bits of the error corrected datastream of step 610 as an output datastream.

At step 614, the operational control flow 600 has determined that one or more errors are not present in the K information bits of the input datastream of step 602. In this step, the operational control flow 600 disables the error correction circuitry, such as the error correction circuitry 410 to provide some examples, that is used to correct one or more errors present in the K information bits of step 602.

At step 616, the operational control flow 600 provides the K information bits of the input datastream of step 602 as the output datastream.

The foregoing Detailed Description discloses an information encoder/decoder for a data storage device. The information encoder/decoder includes an encoder, error checking circuitry, error correction circuitry, and data selection circuitry. The encoder receives an input datastream having a first plurality of information bits and a first plurality of parity bits and to generate a second plurality of parity bits from the first plurality of information bits. The error checking circuitry compares the first plurality of parity bits and the second plurality of parity bits to determine whether an error is present within the first plurality of information bits. The error correction circuitry performs error correction on the first plurality of information bits in accordance with the first plurality of parity bits when the error is present within the first plurality of information bits to provide an error corrected datastream, and to be deactivated when the error is not present within the plurality of information bit. The data selection circuitry configured to provide the first plurality of information bits as an output datastream when the error is not present within the first plurality of information bits or a second plurality of information bits of the corrected datastream as the output datastream when the error is present within the first plurality of information bits.

The foregoing Detailed Description discloses a method for performing error correction in a data storage device. The method includes: receiving an input datastream having a first plurality of information bits and a first plurality of parity bits, generating a second plurality of parity bits from the first plurality of information bits, comparing the first plurality of parity bits and the second plurality of parity bits to determine whether an error is present within the first plurality of information bits, performing error correction on the first plurality of information bits in accordance with the first plurality of parity bits when the error is present within the first plurality of information bits to provide an error corrected datastream, disabling the error correction on the first plurality of information bits in accordance with the first plurality of parity bits when the error is not present within the first plurality of information bits, and providing the first plurality of information bits as an output datastream when the error is not present within the first plurality of information bits or a second plurality of information bits of the corrected datastream as the output datastream when the error is present within the first plurality of information bits.

The foregoing Detailed Description discloses a data storage device having a memory array and an information encoder/decoder. The information encoder/decoder includes an encoder, error checking circuitry, error correction circuitry, and data selection circuitry. The encoder receives an input datastream from the memory array having a first plurality of information bits and a first plurality of parity bits and to generate a second plurality of parity bits from the first plurality of information bits. The error checking circuitry compares the first plurality of parity bits and the second plurality of parity bits to determine whether an error is present within the first plurality of information bits. The error correction circuitry performs error correction on the first plurality of information bits in accordance with the first plurality of parity bits when the error is present within the first plurality of information bits to provide an error corrected datastream, and to be deactivated when the error is not present within the plurality of information bit. The data selection circuitry configured to provide the first plurality of information bits as an output datastream when the error is not present within the first plurality of information bits or a second plurality of information bits of the corrected datastream as the output datastream when the error is present within the first plurality of information bits.

The foregoing disclosure outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. An information encoder/decoder for a data storage device, the information encoder/decoder comprising:
an encoder configured to:
receive an input datastream having a first plurality of information bits and a first plurality of parity bits, and
generate a second plurality of parity bits from the first plurality of information bits;
error checking circuitry configured to compare the first plurality of parity bits and the second plurality of parity bits to determine whether an error is present within the first plurality of information bits;
error correction circuitry configured to:
receive the first plurality of information bits and a power enable, the power enable being at a first logic level to indicate the error is present within the first plurality of information bits or a second logic level to indicate the error is not present within the first plurality of information bits,
activate to perform error correction on the first plurality of information bits based on the first plurality of parity bits when the power enable is at the first logic to provide an error corrected datastream,
deactivate to not perform the error correction on the first plurality of information bits when the power enable is at the second logic level, the error correction circuitry being further configured to be powered-off when the power enable is at the second logic level; and
data selection circuitry configured to provide the first plurality of information bits as an output datastream when the error is not present within the first plurality of information bits or a second plurality of information bits of the corrected datastream as the output datastream when the error is present within the first plurality of information bits.

2. The information encoder/decoder of claim 1, wherein the encoder is configured to generate the second plurality of parity bits from the first plurality of information bits in accordance with an error-correcting code (ECC).

3. The information encoder/decoder of claim 2, wherein the ECC comprises:
a block code; or
a convolutional code.

4. The information encoder/decoder of claim 1, wherein the encoder is configured to receive the input datastream when the data storage device is configured to operate in a read mode of operation.

5. The information encoder/decoder of claim 1, wherein the first plurality of parity bits is generated when the data storage device is configured to operate in a read mode of operation.

6. The information encoder/decoder of claim 1, wherein the error checking circuitry is configured to determine the error is present within the first plurality of information bits when the first plurality of parity bits differs from the second plurality of parity bits.

7. The information encoder/decoder of claim 1, wherein the error checking circuitry is configured to determine the error is not present within the first plurality of information bits when the first plurality of parity bits are similar to the second plurality of parity bits.

8. The information encoder/decoder of claim 1, wherein the error checking circuitry is further configured to provide an error indication at the first logic level when the error is present within the first plurality of information bits or at the second logic level when the error is not present within the first plurality of information bits.

9. The information encoder/decoder of claim 1, wherein the data selection circuitry comprises:
a multiplexing circuit configured to select the first plurality of information bits as the output datastream when the error is not present within the first plurality of information bits or the second plurality of information bits as the output datastream when the error is present within the first plurality of information bits.

10. The information encoder/decoder of claim 1, further comprising:
controller circuitry configured to:
provide the power enable at the first logic level in response to the error checking circuitry determining the error is present within the first plurality of information bits or the second logic level in response to the error checking circuitry determining the error is not present within the first plurality of information bits, and
provide a correction enable at the first logic level in response to the error checking circuitry determining the error is present within the first plurality of information bits or the second logic level in response to the error checking circuitry determining the error is not present within the first plurality of information bits; and
logic circuitry configured to perform a logical operation on the input data stream and the correction enable, the logical operation being configured cause the logic circuitry to provide the first plurality of information bits to the error correction circuitry in response to the correction enable being at the first logic level and to not provide the first plurality of information bits to the error correction circuitry in response to the correction enable being at the second logic level.

11. A method for performing error correction in a data storage device, the method comprising:
receiving an input datastream having a first plurality of information bits and a first plurality of parity bits;
generating a second plurality of parity bits from the first plurality of information bits;
comparing the first plurality of parity bits and the second plurality of parity bits to determine whether an error is present within the first plurality of information bits;
receiving the first plurality of information bits and a power enable, the power enable being at a first logic level to indicate the error is present within the first plurality of information bits or a second logic level to indicate the error is not present within the first plurality of information bits;
activating to perform error correction on the first plurality of information bits based on the first plurality of parity bits when the power enable is at the first logic level to provide an error corrected datastream;
deactivating to not perform the error correction on the first plurality of information bits when the power enable is at the second logic level; and
providing the first plurality of information bits as an output datastream when the error is not present within the first plurality of information bits or a second plurality of information bits of the corrected datastream as the output datastream when the error is present within the first plurality of information bits.

12. The method of claim 11, wherein the generating comprises:
generating the second plurality of parity bits from the first plurality of information bits in accordance with an error-correcting code (ECC).

13. The method of claim 12, wherein the ECC comprises:
a block code; or
a convolutional code.

14. The method of claim 11, wherein the receiving the input datastream comprises:
receiving the input datastream when the data storage device is operating in a read mode of operation.

15. The method of claim 11, further comprising:
generating the first plurality of parity bits when the data storage device is operating in a read mode of operation.

16. The method of claim 11, further comprising:
determining the error is present within the first plurality of information bits when the first plurality of parity bits differs from the second plurality of parity bits.

17. The method of claim 11, further comprising:
determining the error is not present within the first plurality of information bits when the first plurality of parity bits are similar to the second plurality of parity bits.

18. A data storage device, comprising:
a memory array; and
an information encoder/decoder coupled to the memory array, the information encoder/decoder comprising:
an encoder configured to:
receive, from the memory array, an input datastream having a first plurality of information bits and a first plurality of parity bits, and
generate a second plurality of parity bits from the first plurality of information bits;
error checking circuitry configured to compare the first plurality of parity bits and the second plurality of parity bits to determine whether an error is present within the first plurality of information bits;
error correction circuitry configured to:
receive the first plurality of information bits and a power enable, the power enable being at a first logic level to indicate the error is present within the first plurality of information bits or a second logic level to indicate the error is not present within the first plurality of information bits,
activate to perform error correction on the first plurality of information bits based on the first plurality of parity bits when the power enable is at the first logic level to provide an error corrected datastream,
deactivate to not perform the error correction on the first plurality of information bits when the power enable is at the second logic level, the error correction circuitry being further configured to be powered-off when the power enable is at the second logic level; and
data selection circuitry configured to provide, based on the error indication, the first plurality of information bits as an output datastream when the error is not present within the first plurality of information bits or a second plurality of information bits of the corrected datastream as the output datastream when the error is present within the first plurality of information bits.

19. The data storage device of claim 18, wherein the error checking circuitry is configured to determine the error is present within the first plurality of information bits when the first plurality of parity bits differs from the second plurality of parity bits or to determine the error is not present within the first plurality of information bits when the first plurality of parity bits are similar to the second plurality of parity bits.

20. The data storage device of claim 18, wherein the error checking circuitry is further configured to provide an error indication at the first logic level when the error is present within the first plurality of information bits or at the second logic level when the error is not present within the first plurality of information bits, and wherein the error correction circuitry is further configured to be powered-on when the error indication is at the first logic level and to be powered-off when the error indication is at the second logic level.

* * * * *